US012604449B2

(12) United States Patent
Miller et al.

(10) Patent No.: US 12,604,449 B2
(45) Date of Patent: Apr. 14, 2026

(54) ELECTROMAGNETIC ABSORBING COMPOSITES

(71) Applicant: 3M INNOVATIVE PROPERTIES COMPANY, St. Paul, MN (US)

(72) Inventors: Adam D. Miller, Vadnais Heights, MN (US); Sergei A. Manuilov, Bayport, MN (US); Michael S. Graff, Woodbury, MN (US); Dipankar Ghosh, Oakdale, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 476 days.

(21) Appl. No.: 18/257,040

(22) PCT Filed: Dec. 7, 2021

(86) PCT No.: PCT/IB2021/061413
§ 371 (c)(1),
(2) Date: Jun. 12, 2023

(87) PCT Pub. No.: WO2022/144638
PCT Pub. Date: Jul. 7, 2022

(65) Prior Publication Data
US 2024/0040759 A1 Feb. 1, 2024

Related U.S. Application Data

(60) Provisional application No. 63/199,449, filed on Dec. 29, 2020.

(51) Int. Cl.
*H05K 9/00* (2006.01)
*C08K 9/02* (2006.01)
*C09C 1/00* (2006.01)

(52) U.S. Cl.
CPC ............. *H05K 9/0083* (2013.01); *C08K 9/02* (2013.01); *C09C 1/0078* (2013.01);
(Continued)

(58) Field of Classification Search
None
See application file for complete search history.

(56) References Cited

U.S. PATENT DOCUMENTS 3,404,034 A 10/1968 Maurer et al.
3,549,412 A * 12/1970 Frey, Jr. .................. C23C 18/02
427/217
(Continued)

FOREIGN PATENT DOCUMENTS

EP 0479438 B1 4/1997
GB 396231 A 8/1933
(Continued)

OTHER PUBLICATIONS

CN 106696410 A (Abstract). (Year: 2017).*
(Continued)

*Primary Examiner* — Joseph D Anthony
(74) *Attorney, Agent, or Firm* — Philip P. Soo; Lynn R. Hunsberger

(57) ABSTRACT

A composite comprising a polymeric matrix and EM absorbers dispersed within the polymeric matrix. Each EM absorber comprises a dielectric flake, and a continuous magnetic coating on at least one major surface of the dielectric flake. The EM absorbers function as dielectric and magnetic absorbers in the 1-100 GHz frequency range. The composite can be used as an electromagnetic shielding article to mitigate electromagnetic interference in, for example, high speed, high frequency (HSHF) consumer electronics.

20 Claims, 2 Drawing Sheets

(52) U.S. Cl.
CPC ...... *C01P 2004/20* (2013.01); *C01P 2004/80* (2013.01); *C01P 2006/40* (2013.01); *C01P 2006/42* (2013.01); *C08K 2201/01* (2013.01)

(56) References Cited

U.S. PATENT DOCUMENTS

| | | | | |
|---|---|---|---|---|
| 4,264,648 | A | 4/1981 | Ziolo et al. | |
| 5,389,434 | A * | 2/1995 | Chamberlain | H01Q 17/004 |
| | | | | 427/205 |
| 5,673,148 | A | 9/1997 | Morris et al. | |
| 5,925,455 | A * | 7/1999 | Bruzzone | H05B 6/6491 |
| | | | | 428/328 |
| 6,310,141 | B1 | 10/2001 | Chen et al. | |
| 6,972,097 | B2 * | 12/2005 | Yoshida | H01F 1/22 |
| | | | | 257/E23.114 |
| 7,495,181 | B2 * | 2/2009 | Matsushita | H01Q 17/007 |
| | | | | 174/392 |
| 8,698,394 | B2 | 4/2014 | Mccutcheon et al. | |
| 8,906,504 | B2 | 12/2014 | Kniess et al. | |
| 9,704,613 | B2 | 7/2017 | Ghosh et al. | |
| 10,340,054 | B2 | 7/2019 | Ghosh et al. | |
| 10,774,218 | B2 * | 9/2020 | Kinlen | H01F 1/0306 |
| 2008/0283188 | A1 * | 11/2008 | Oda | C01G 49/0018 |
| | | | | 524/435 |
| 2010/0181522 | A1 * | 7/2010 | Kim | C22C 38/10 |
| | | | | 252/62.51 R |
| 2010/0294558 | A1 | 11/2010 | Mitsui et al. | |
| 2011/0056593 | A1 * | 3/2011 | Lee | H01Q 17/002 |
| | | | | 977/777 |
| 2016/0333167 | A1 * | 11/2016 | Gray | C08J 5/005 |
| 2019/0289759 | A1 | 9/2019 | West et al. | |
| 2020/0053920 | A1 | 2/2020 | Ghosh | |
| 2020/0258666 | A1 * | 8/2020 | Kou | H01F 1/33 |
| 2023/0193101 | A1 | 6/2023 | Manuilov | |
| 2024/0098950 | A1 * | 3/2024 | Miller | H05K 9/0083 |

FOREIGN PATENT DOCUMENTS

| | | |
|---|---|---|
| JP | 2019057561 A | 4/2019 |
| WO | 1996041354 A1 | 12/1996 |
| WO | 2018080703 A1 | 5/2018 |
| WO | 2018080755 A1 | 5/2018 |
| WO | 2018081394 A1 | 5/2018 |
| WO | 2019082013 A1 | 5/2019 |
| WO | 2021074768 A1 | 4/2021 |

OTHER PUBLICATIONS

Ghosh et al., "Structural and high GHz frequency EMI (electromagnetic interference) properties of carbonyl iron and boron nitride hybrid composites", Materials Research Express, 2019, vol. 6, 106305, pp. 1-12.
International Search Report for PCT International Application No. PCT/IB2021/061413, mailed on Feb. 24, 2022, 4 pages.

* cited by examiner

ELECTROMAGNETIC ABSORBING COMPOSITES

CROSS REFERENCE TO RELATED APPLICATIONS

This application is a national stage filing under 35 U.S.C. 371 of PCT/IB2021/061413, filed Dec. 7, 2021, which claims the benefit of U.S. Provisional Patent Application No. 63/199,449, filed Dec. 29, 2020, the disclosure of which is incorporated by reference in its/their entirety herein.

FIELD OF INVENTION

The present invention relates to electromagnetic absorbing composites that may be used to shield electronic devices or radiation sources, articles containing the composites, and methods of making the composites.

BACKGROUND

Electromagnetic interference (EMI) is a common issue encountered in electronic systems, such as electronic communications systems. Outside electromagnetic radiation is well known to induce undesirable currents in electronic components, thereby disrupting their normal operations. In order to protect against such effects, it is common to completely shield an electronic device or component via highly conductive enclosures, such as coatings, gaskets, adhesives sealants, wire sleeves, metal meshes or filters, and the like. These types of shields operate by reflecting the unwanted electromagnetic fields away from the sensitive component. Another form of protection is offered by electromagnetic absorbing materials. These are typically not highly conductive and operate by absorbing the unwanted electromagnetic energy and converting it to heat. Absorbers are widely used in radar and stealth applications. They are also commonly found inside of electronic devices where they are used to control electromagnetic emissions from the device. Electromagnetic absorbers can be classified as magnetic absorbers if they interact principally with the magnetic field component of an electromagnetic wave or as dielectric absorbers if they interact principally with the electric field component of the electromagnetic wave. Electromagnetic absorbers are especially beneficial in a high frequency regime, for example, in the 1-40 GHz or 1-100 GHz frequency range and harmonics associated with such base frequencies.

There remains a need for flexible and versatile electromagnetic absorbing materials that can be used to mitigate electromagnetic interference. These materials should be lightweight, readily handled in industrial processes, and have loss characteristics that are appropriate to the frequency range of interest for a particular application.

SUMMARY

The present disclosure provides a composite comprising a polymeric matrix and electromagnetic (EM) absorbers dispersed therein. The EM absorbers comprise magnetically coated dielectric flakes. Composites of the present disclosure are capable of mitigating electromagnetic interference in the 1-100 GHz frequency range, more particularly the 1-20 GHz frequency range.

In one embodiment, the present disclosure provides a composite comprising a polymeric matrix and EM absorbers dispersed within the polymeric matrix, each EM absorber comprising a dielectric flake and a continuous magnetic coating on at least one major surface of the dielectric flake, wherein the EM absorbers function as dielectric and magnetic absorbers in the 1-100 GHz frequency range.

In another embodiment, the present disclosure provides an electromagnetic interference shielding article comprising the composite.

In a further embodiment, the present disclosure provides a method of making the composite.

The following definitions shall be applied to the defined terms through the entire application, unless otherwise stated to the contrary. As used herein:

The term "comprises" and variations thereof do not have a limiting meaning where these terms appear in the description and claims. Such terms will be understood to imply the inclusion of a stated step or element or group of steps or elements but not the exclusion of any other step or element or group of steps or elements. By "consisting of" is meant including, and limited to, whatever follows the phrase "consisting of" Thus, the phrase "consisting of" indicates that the listed elements are required or mandatory, and that no other elements may be present. By "consisting essentially of" is meant including any elements listed after the phrase, and limited to other elements that do not interfere with or contribute to the activity or action specified in the disclosure for the listed elements. Thus, the phrase "consisting essentially of" indicates that the listed elements are required or mandatory, but that other elements are optional and may or may not be present depending upon whether or not they materially affect the activity or action of the listed elements.

In this application, terms such as "a," "an," and "the" are not intended to refer to only a singular entity, but include the general class of which a specific example may be used for illustration.

The term "and/or" means one or all of the listed elements or a combination of any two or more of the listed elements.

The recitations of numerical ranges by endpoints include all numbers subsumed within that range as well as the endpoints (e.g., 1 to 5 includes 1, 1.5, 2, 2.75, 3, 3.80, 4, 5, etc.).

Reference throughout this specification to "some embodiments" means that a particular feature, configuration, composition, or characteristic described in connection with the embodiment is included in at least one embodiment of the disclosure. Thus, the appearances of such phrases in various places throughout this specification are not necessarily referring to the same embodiment of the disclosure. Furthermore, the particular features, configurations, compositions, or characteristics may be combined in any suitable manner in one or more embodiments.

The words "preferred" and "preferably" refer to embodiments of the disclosure that may afford certain benefits, under certain circumstances; however, other embodiments may also be preferred, under the same or other circumstances. Furthermore, the recitation of one or more preferred embodiments does not imply that other embodiments are not useful, and is not intended to exclude other embodiments from the scope of the disclosure.

The term "composite" refers to a material in which two or more materials coexist without chemical interaction, and one or more phases can be discrete or continuous.

The terms "polymer" and "polymeric matrix" refer to both materials prepared from one monomer such as a homopolymer or to materials prepared from two or more monomers such as a copolymer, terpolymer, or the like. The term "copolymer" refers to a polymeric material prepared from at least two monomers.

The term "fluorocarbon-based" refers to a material that is fluorinated. Typically, the fluorocarbon-based materials of this disclosure are highly fluorinated.

The term "fluorinated" when used in conjunction with polymer, monomer, or group associated with a polymer or a monomer, refers to having at least one hydrogen atom replaced with a fluorine atom. The term "highly fluorinated" refers to polymers, monomers, or groups where many hydrogen atoms have been replaced with fluorine atoms, in some cases at least half of the hydrogen atoms have been replaced by fluorine atoms, and in other cases, nearly all of the hydrogen atoms have been replaced with fluorine atoms.

The term "(meth)acrylate" refers to both acrylate and methacrylate materials.

The term "epoxy" as used herein refers to reactive group that is three membered ring including two carbon atoms and an oxygen atom, commonly referred to as an "oxirane ring". The term "epoxy resin" as used herein is in agreement with the generally understood usage for this term in the art and is used to describe curable materials containing one or more epoxy groups.

The term "continuous" in the context of "continuous magnetic coating" means a continual, unbroken magnetic coating. The continuous nature of the coating is independent of the process used to apply it. For example, the continuous magnetic coating can be formed from individual droplets of magnetic material that then coalesce to form a continuous magnetic coating.

The term "overlie" means to extend over so as to at least partially cover another layer or element. Overlying layers can be in direct or indirect contact (e.g., separated by one or more additional layers).

The above summary of the present disclosure is not intended to describe each disclosed embodiment or every implementation of the present disclosure. The description that follows more particularly exemplifies illustrative embodiments.

DETAILED DESCRIPTION

Figure 1:
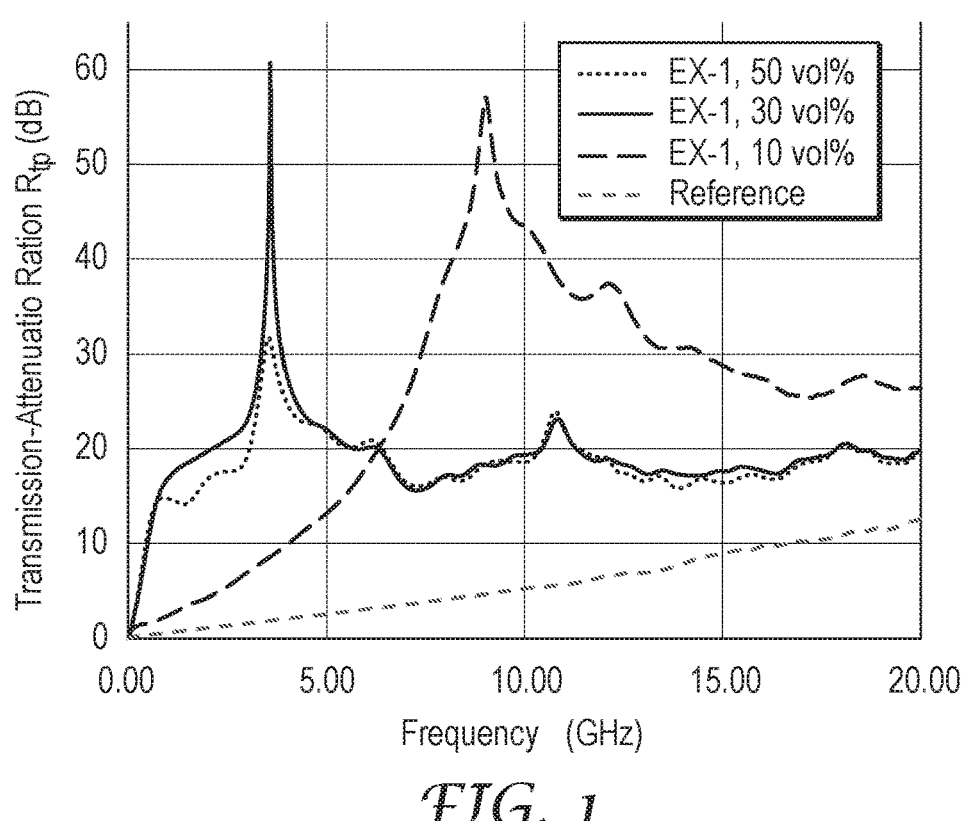
FIG. 1 is a plot of Transmission-Attenuation Ratio, $R_{tp}$, vs. Frequency for the composites of Example E-1 at loading levels of 10, 30 and 50 volume %.

In the following description of illustrative embodiments, reference is made to the accompanying figures of the drawings which form a part hereof, and in which are shown, by way of illustration, specific embodiments. It is to be understood that other embodiments may be utilized and structural changes may be made without departing from the scope of the present invention.

In general, the present disclosure relates to a composite comprising a polymeric matrix and EM absorbers dispersed within the matrix. The EM absorbers each comprise a dielectric flake and a continuous magnetic coating on at least one major surface of the dielectric flake. The EM composites of the present disclosure are capable of mitigating electromagnetic interference in the 1-100 GHz frequency range, more particularly the 1-20 GHz frequency range.

The components of the composite are described in further detail below.

EM Absorber

Each EM absorber comprises a dielectric flake. The term "flake", as used herein, refers to a flat particle having opposing major surfaces and a thickness therebetween, where the ratio of the length to width along a major surface of the flat particle ranges from 1:3 to 3:1, more particularly from 1:2 to 2:1 and the aspect ratio of the flat particle is at least 10:1, 100:1, 200:1, 300:1, 400:1, 500:1, 600:1, 700:1, 800:1, 900:1 and less than 1000:1, 900:1, 800:1, 700:1, 600:1, 500:1, 400:1, 300:1. The length of the flat particle refers to the longest dimension across a major surface of the particle and the width refers to the shortest dimension across the major surface of the flat particle. The aspect ratio refers to the diameter of the smallest circle that encompasses the flat particle in a direction parallel to the major surfaces divided by the thickness of the flat particle. For purposes of illustration, a flat square particle that has a length and width of 120 micrometers and thickness of 0.7 micrometers would have an aspect ratio of 243, i.e. 170 micrometers (the diameter of smallest circle encompassing the flake is the diagonal of the square) divided by 0.7 micrometers (thickness of flake).

The term "dielectric flake", as used herein, refers to an insulating or nonconductive flake having a resistivity of at least 1 Ohm·m. The dielectric flake may or may not be magnetic. In some embodiments, the dielectric flake is nonmagnetic.

The composition of the flakes is not particularly limiting, as long as the materials used to make the flakes are dielectric and processible into flakes. A dielectric flake of the present disclosure may comprise a metal oxide (e.g., alumina or silica), a metal nitride (e.g., boron nitride), a metal carbide, a metal sulfide, a metal silicide, a metal boride, a mixed ceramic, an aluminate glass (e.g., boroaluminate glass), or a silicate glass (e.g., borosilicate glass, aluminosilicate glass, and soda-lime glass).

In some embodiments, the dielectric flake comprises a metal oxide, a metal nitride, an aluminate glass, or a silicate glass.

In some embodiments, the dielectric flake comprises a silicate glass, more particularly a borosilicate glass, an aluminosilicate glass or a soda-lime glass, or even more particularly, a borosilicate glass.

The dielectric flakes disclosed herein typically have a thickness ranging from 0.1 micrometers to 5 micrometers, particularly 0.3 micrometers to 1.0 micrometer.

Particularly suitable for use as a dielectric flake are silicate glasses, more particularly, borosilicate glasses. In some embodiments, the dielectric flake is a borosilicate glass having a thickness ranging from 0.3 micrometers to 1.0 micrometer and an aspect ratio ranging from 20 to 300, more particularly 20 to 230.

The EM absorber further comprises a continuous magnetic coating on at least one major surface of the dielectric flake. The magnetic coating may be applied to the dielectric flakes by known techniques, such as the metal solvent plating technique disclosed in U.S. Pat. No. 3,549,412 (Frey, et al.). In some embodiments, the magnetic coating covers at least 70%, at least 75%, at least 80%, at least 85%, at least 90% or at least 95% of the major surface. In some embodiments, the magnetic coating covers 100% of the major surface. In some embodiments, the magnetic coating completely encapsulates the dielectric flake. In some embodiments, the magnetic coating is uniform (i.e. the coating thicknesses across a major surface of the dielectric flake are within ±5% of some value).

An EM absorber is not limited to a single magnetic coating and may in some embodiments include at least two magnetic coatings, where each coating comprises the same or different magnetic material. The two or more magnetic coatings may cover different regions of the ceramic particle surface (e.g., each major surface is coated with a different magnetic material). In some embodiments, the magnetic coatings may at least partially overlap, such that at least a portion of one magnetic coating overlies at least a portion of one or more other magnetic coatings. In some preferred embodiments, a first magnetic coating encapsulates the dielectric flake and a second magnetic coating completely encapsulates the first magnetic coating, forming an EM absorber with core/shell/shell configuration. The thickness of each magnetic coating may be the same or different.

Suitable magnetic coatings may include, for example, a ferromagnetic or ferrimagnetic material. In some embodiments, the magnetic coating may comprise a metal, such as iron, cobalt or nickel; a metal alloy such as nickel-iron, nickel-iron-molybdenum, iron-silicon-aluminum (Sendust), iron-silicon-chromium (Iron-silicide) or iron carbonyl; a ceramic ferrite; or a combination thereof.

In some preferred embodiments, the magnetic coating is iron metal.

The absorption frequency and bandwidth of the EM absorbers can be tailored by the selection of materials making up the dielectric flakes and magnetic coatings, the size of the dielectric flakes, the thicknesses (i.e. amount) of the magnetic coatings thereon; and/or the ratio of components of the magnetic coating to components of the dielectric flakes.

The thickness of the magnetic coating, whether a single magnetic coating or the combination of two or more magnetic coatings, is typically less than the thickness of the dielectric flake. Preferably, the thickness of the magnetic coating is enough to reduce or eliminate depolarization of the EM absorbers. In some embodiments, the thickness of the magnetic coating ranges from 10 nanometers to 1.0 micrometers.

Although the magnetic coating may undergo surface oxidation in some instances, depending upon the nature of the magnetic coating, manufacturing process, and environmental conditions, it is preferable that the oxidation does not extend into the bulk of the magnetic coating. In some embodiments, surface oxidation extends less than 30%, less than 25%, less than 20%, less than 15%, less than 10%, less than 5%, or even less than 1% into the magnetic coating as measured in a direction perpendicular to the major surface of the dielectric flake (i.e. in direction of thickness of the magnetic coating).

EM absorbers of the present application typically exhibit a saturation magnetization $M_s$ per mass of absorber of at least 45, at least 50, at least 55, at least 60, at least 65, at least 70, at least 75, or at least 80 emu/g.

In some embodiments where the magnetic coating is a conductive metal, a dielectric coating (e.g., silica or alumina coating) can be applied to the exposed surface of the conductive magnetic coating. The dielectric coating is particularly beneficial in composites having high EM absorber loading values. As the EM absorber concentration increases within the composite, the contact area between particles increases resulting in increased DC electrical conductivity of the composite. This also correlates with a higher permittivity of the composite. This can result in a composite with greater EMI reflectance and lower EMI absorption. The dielectric coating reduces or inhibits electrical conductivity between EM absorbers within the composite, allowing for greater resistivity and EMI absorption at a given loading level. The dielectric coating also lowers the permittivity of the composite, which becomes more pronounced as the loading levels increase.

Polymeric Matrix

The polymeric matrix is inert to the EM absorbers but otherwise nonlimiting. The polymeric matrix may comprise a chlorine-containing polymer, a fluorocarbon-based polymer, an epoxy-based polymer, a (meth)acrylate polymer, a polyether polymer, co-polymers of such, or a combination thereof.

Examples of suitable chlorine-containing polymers include polyvinyl chloride polymers (PVCs) and polyvinylidene chloride polymers (PVDC).

Examples of fluorocarbon-based polymers include vinylidene fluoride (VDF)-containing fluorocarbon-based polymers. Examples include the materials THV 200, THV 400, THV 500G commercially available from 3M Corp, St. Paul, Minn.; KYNAR 720, KYNAR 740, KYNAR 1000HD, and KYNAR ADX commercially available from ARKEMA, Philadelphia, Pa.; HYLAR 700 commercially available from Ausimont USA Inc., Morristown, N. J.; and FLUOREL FC-2178 commercially available from 3M Corp, St. Paul, Minn. Particularly useful are the poly-VDF polymers KYNAR 720, KYNAR 740, KYNAR 1000HD, and KYNAR ADX commercially available from ARKEMA, Philadelphia, Pa.

Other suitable fluorocarbon-based polymers include those copolymers prepared from the fluorocarbon-based monomers tetrafluoroethylene (TFE), hexafluoropropylene (HFP), and VDF. Examples of such polymers are described in U.S. Pat. No. 6,310,141 (Chen et al.). Examples of suitable fluorocarbon-based polymers include, for example, terpolymers of 20-60 wt. % TFE, 30-wt. % HFP, and 10-40% VDF. These terpolymers are commercially available from 3M Company, St. Paul, Minn. under the trade name "THV". Additional examples include hexafluoropropylene-tetrafluoroethylene-ethylene (HTE) terpolymers, ethylene-tetrafluoroethylene (ETFE) copolymers, hexafluoropropylene-tetrafluoroethylene (FEP), and tetrafluoroethylene-perfluoro(alkoxy alkane) (PFA) copolymers. These copolymers are also available from 3M Company, St. Paul, Minn.

Examples of suitable epoxy-based polymers include a wide range of epichlorohydrin-based polymers and curable epoxy resin-based polymers. Suitable epichlorohydrin-based polymers include poly-epichlorohydrin such as the epichlorohydrin homopolymer commercially available from Zeon Chemical as HYDRIN H (CO), epichlorohydrin copolymers such as the copolymer of epichlorohydrin and ethylene oxide commercially available from Zeon Chemical as HYDRIN C (ECO), and the terpolymer of epichlorohydrin, ethylene oxide, and allyl glycidyl ether commercially available from Zeon Chemical as HYDRIN T. Suitable curable epoxy resins include those based upon bisphenol-A, bisphenol-F, phenol novolacs, or combinations thereof. Examples of suitable epoxy resins based upon bisphenol-A include: EPON 828 (liquid epoxy resin) and EPON 1001F (solid epoxy resin), commercially available from Momentive Specialty Chemicals, Columbus, Ohio; DER 6508 (high molecular weight epoxy resin) commercially available from Dow Chemical Company, Midland Mich.; and EPDXI-CURE resin (a low molecular weight epoxy resin) commercially available from Buehler, Lake Bluff, Ill. An example of a suitable bisphenol-F epoxy resin is EPON 862 (a low molecular weight epoxy resin) commercially available from Momentive Specialty Chemicals, Columbus, Ohio. Examples of suitable epoxy resins based upon phenol novolacs include: EPON 1050, commercially available from Momentive Specialty Chemicals, Columbus, Ohio; and ARALDITE ECN 1299 commercially available from Huntsman Advanced Materials Americas, Inc., The Woodlands, Texas. Mixtures or epoxy resins can also be used. The epoxy resins can be cured using a wide variety of curing agents including amine-based curing agents, phenolic curing agents, and anhydride-based curing agents.

Examples of suitable (meth)acrylate polymers and copolymers include polymethyl acrylate polymers (PMA) and polymethyl methacrylate polymers (PMMA) which demonstrate a high degree of amorphous content, polar groups from the (meth)acrylate functionality, and generally show moderate dielectric loss at room temperature.

Examples of polyether polymers include polyethylene oxide and copolymers of such, and polypropylene oxide and copolymers of such.

Other suitable polymeric matrices may include a silicone, a cyclic olefin copolymer (COC), a low-density polyethylene (LDPE), a high-density polyethylene (HDPE), a polystyrene (PS), a polypropylene (PP), a polyphenylene sulfide (PPS), a polyimide (PI), a syndiotactic polystyrene (SPS), a butyl rubber, an acrylonitrile butadiene styrene (ABS), a polycarbonate (PC), a polyurethane, polyvinyl butyral, or a combination thereof.

In some preferred embodiments, the polymeric matrix includes polyvinyl butyral, due to its relatively good adhesive properties and ease of handling with respect to solvent casting and hot melt lamination.

Composite

The composites of the present disclosure generally mitigate electromagnetic interference in the frequency range from 1 GHz to 100 GHz, more particularly from 1 GHz to 20 GHz. However, it is possible to tune the frequency range, as well as the bandwidth and magnitude of electromagnetic absorption by adjusting the number, composition and/or physical parameters of the EM absorbers within the composite.

The composites of the present disclosure may comprise a single type of EM absorber. Alternatively, the composites of the present disclosure may comprise two or more different types of EM absorbers, wherein the two or more different types of EM absorbers comprise different dielectric flakes (e.g., different compositions and/or sizes), different magnetic coatings (e.g., different compositions, different surface coverages, and/or different thicknesses), different ratio of components in the magnetic coatings to components in the dielectric flakes, or a combination thereof.

For example, a composite may comprise a first type of EM absorber having a first dielectric flake and a first magnetic coating on at least one major surface of the first dielectric flake. The composite may further comprise a second type of EM absorber having a second dielectric flake, and a second magnetic coating on at least one major surface of the second dielectric flake. In some embodiments, the first and second dielectric flakes comprise the same material, and the material used to make the first magnetic coating is different from the material used to make the second magnetic coating. In another embodiment, the first and second dielectric flakes are made from the same material, the first and second magnetic coatings are made from the same material, but the thicknesses of the first and second magnetic coatings are different. In yet another embodiment, the first and second dielectric flakes are made from the same material, the first and second magnetic coatings are made from the same material, but the ratios of components in the magnetic coating to components in the dielectric flakes are different.

Typically, the EM absorbers make up 5 to 90 wt %, more particularly 7 to 85 wt %, and even more particularly 10 to 80 wt % of the composite. In some embodiments, the EM absorbers can be present in an amount, for example, greater than 5 wt %, greater than 7 wt %, greater than 10 wt %, greater than 30 wt %, greater than 40 wt %, greater than 50 wt %, greater than 60 wt %, or greater than 70 wt %, and present in an amount, for example, less than 90 wt %, less than 85 wt%, less than 80 wt %, less than 70 wt %, less than 60 wt %, less than 50 wt %, or less than 40 wt%.

The composites of the present disclosure can be made by forming the EM absorbers by applying a continuous magnetic coating to at least one major surface of the dielectric flake using, for example, the solvent plating technique disclosed in U.S. Pat. No. 3,549,412 (Frey, et al.), and dispersing the EM absorbers in the polymeric matrix.

Suitable composites of the present disclosure typically exhibit an imaginary component of relative permeability, $\mu_r''$, greater than 1 and/or an imaginary component of relative permittivity, $\varepsilon_r''$, greater than 1. Suitable composites of the present disclosure may also exhibit a dielectric lossy composite where dielectric loss tangent $\tan(\varepsilon_r) = \varepsilon_r''/\varepsilon_r'$ is at least 0.01 while the real component of relative permittivity, $\varepsilon_r'$, is adjusted depending on absorber application, for example within 5-50.

A particularly suitable embodiment of composites of this disclosure include those where the polymeric matrix comprises polyvinyl butyral, and the EM absorbers comprise a borosilicate glass with a continuous iron metal coating on at least one major surface of the dielectric flake. The EM absorbers comprising the borosilicate glass and iron metal can make up at least 10, at least 20, at least 30, at least 40, at least 50, at least 60, at least 70 wt % of the composite. The mass ratio of silicon in the borosilicate glass to iron metal in the magnetic coating can range from 0.1 to 0.5. In some embodiments, the iron magnetic coating may be further coated with silica.

Composites of the present application can be used to make electromagnetic interference shielding articles for use, for example, in high speed, high frequency (HSHF) electronics, include phones, high speed data servers, interconnects, etc.

EXAMPLES

Objects and advantages of this invention are further illustrated by the following examples, but the particular materials and amounts thereof recited in these examples, as well as other conditions and details, should not be construed to unduly limit this invention. These examples are merely for illustrative purposes only and are not meant to be limiting on the scope of the appended claims.

All materials are commercially available, for example from Sigma-Aldrich Chemical Company, Milwaukee, WI, USA, or known to those skilled in the art, unless otherwise stated or apparent.

The following abbreviations are used in this section: mL=milliliters, g=grams, lbs=pounds, cm=centimeters, mm=millimeters, m=meters, μm=micrometers, mil=thousandths of an inch, s=seconds, min=minutes, h=hours, RPM=revolutions per minute, Oe=Oersted, GHz=gigaHertz, vol %=percent by volume, wt %=percent by weight, ° C.=degrees Celsius, cc=cubic centimeters, dB=Decibel, M=molar, G=Gauss, N=Newtons. Abbreviations for materials used in this section, as well as descriptions of the materials, are provided in Table 1.

TABLE 1

| Material | Details |
| --- | --- |
| high aspect ratio glass flake | 0.7 μm thick and 160 μm diameter, uncoated, E-glass flakes, available under the trade designation FINEFLAKE ™ MEG160FY, Nippon Sheet Glass Co., LTD., Tokyo, Japan |
| low aspect ratio glass flake | Borosilicate glass flake with nominal substrate thickness 350 nm and diameter 10-40 μm, coated with $SnO_2$ and $TiO_2$, available under the trade designation ASTRAL BLUE SUPER SHIMMER GFE-ABSS from Glassflake Ltd, Leeds, UK |
| mid aspect ratio glass flake | Borosilicate glass flake with nominal substrate thickness 350 nm and diameter 30-100 μm, coated with $SnO_2$ and $TiO_2$, available under the trade designation ASTRAL BLUE SHIMMER GFE-ABS from Glassflake Ltd, Leeds, UK |
| color-coated glass flake | Iron oxide coated glass flake with average particle size 80 μm and thickness 1 μm available under the trade designation METASHINE MT1080KR from Nippon Sheet Glass Ltd., Tokyo, Japan |
| Permalloy flakes | Permalloy Flake available from Novamet Specialty Products Corporation, Lebanon, TN |
| iron pentacarbonyl | Pentacarbonyliron, 99.5%, available from Alfa Aesar, Haverhill, MA |
| n-octane | octane, anhydrous, ≥99%, available from Sigma Aldrich |
| heptane | n-Heptane, 99%, available from Alfa Aesar |
| Toluene | Available from Sigma Aldrich |
| Ethanol | Available from Sigma Aldrich |
| BUTVAR-B-98 | Thermoplastic, polyvinyl butyral resin available under the trade designation BUTVAR B-98 from Eastman Chemical, Kingsport, TN |
| Solsperse 13940 | A solution of 40% active polymeric dispersant in 240/260 (° C.) aliphatic distillate available under the trade designation SOLSPERSE 13940 from Lubrizol, Wickliffe, Ohio |

Characterization Methods

Magnetic Properties Test Method

The magnetic properties of the particles were tested at room temperature with a Lake Shore 7400 Series vibrating sample magnetometer (VSM) (Lake Shore Cryotronics, Inc., Westerville, OH, USA). The mass of the particles was measured (balance model MS105DU, Mettler Toledo, Switzerland) prior to the magnetic measurements. The mass of the empty VSM sample holder, similar to a Lake Shore Model 730935 (P/N 651-454), was used to zero the balance. For each sample, a new VSM holder was used. After the particles were loaded into the VSM sample holder (into the approximately 15 mm tap of the holder), the mass of powder was measured. To secure the powder in the tap of the holder, adhesive (3M SCOTCH-WELD Instant Adhesive ID No. 62-3801-0330-9, 3M Company, Maplewood, MN, USA) was applied. The adhesive dried for at least 4 hours prior to the measurement. The magnetic moment (emu) of the particles was measured at magnetic field H=18 kilooersted (kOe). The saturation magnetization $M_s$ per mass of the particles (emu/g) was calculated by dividing measured magnetic moment at 18 kOe to the mass of the particles. For particles the measured coercive force Hc (Oe) and remanent magnetization $M_R/M_s$ was also recorded. These values were taken from the magnetization loops recorded by sweeping magnetic field H from +20 to −20 kOe. The sweeping speed of the magnetic field H for each measurement was 26.7 Oe/s.

Magnetic density $4\pi M_s$ of composites was measured using same equipment as in paragraph above. A disk of diameter D=0.6 cm was cut from each composite sample. Thickness t of each disk was measured using a thickness gauge available under the trade designation ID-C112E from Mitutoyo, Aurora, IL. The standard VSM sample holder was used and sample (disk) was attached to the holder using double sided tape. A magnetic field of 18 kOe was applied in the plane of the sample (disk) and the magnetic moment M (emu) was measured. Magnetic density was calculated as $4\pi M_s = 4 \cdot M/t \cdot (D/2)^2$, where the units of this quantity are Gauss (G).

Elemental Analysis Test Method

The relative amount of iron to silicon of particles was measured with an Olympus Delta Professional handheld XRF analyzer from Olympus Corp., Japan. The samples were loaded into a 3 cm diameter sample cup with a 0.12 mil (0.003 mm) Mylar sample window such that the entire bottom of the sample window was covered with powder (about 5 mm deep). The weight percentage of the detected elements was determined from the "GeoChem" calibration of the instrument, and the weight ratio of the elements of interest are presented in Table 6.

Electromagnetic Noise Suppression Test

The noise suppression performance of the composites was tested following IEC 62333-2, section 4.3. Samples of composites were cut into 50×50 mm squares and laid down on 50 Ohm stripline made of conventional FR4 board (1.57 mm thick and RF signal line width of 3.3 mm). Samples were pressed down to stripline with Styrofoam block in accordance with IEC 62333-2 (2006). The S parameters were measured using vector network analyzer Rohde & Schwarz ZNB20. RF cables were calibrated following ZNB20 manufacture procedure. Electromagnetic noise suppression efficiency of composites is represented by transmission attenuation ratio Rtp given in (IEC 62333-2, section 4.3.5.4) as $$R_{tp}(\text{dB}) = 10\log_{10}\left(\frac{1 - |S_{11}|^3}{|S_{21}|^2}\right)$$

Figure 2:
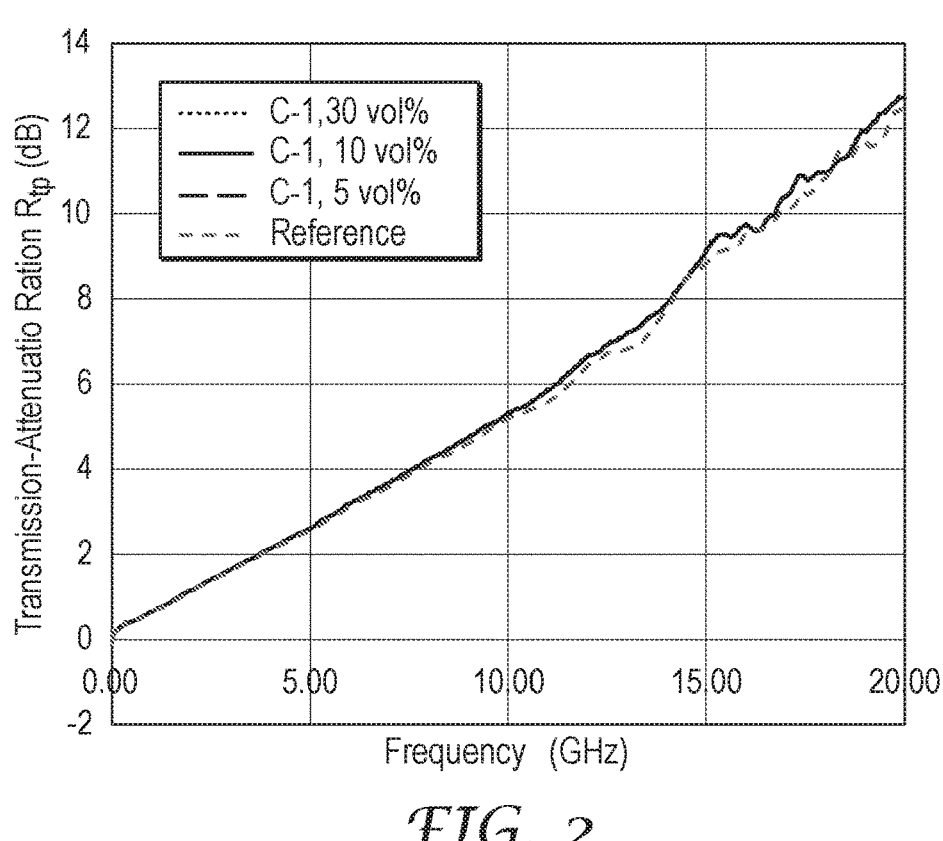
FIG. 2 is a plot of Transmission-Attenuation Ratio, $R_{tp}$, vs. Frequency for the composites of Comparative Example C-1 at loading levels of 5, 10 and 30 volume %.
Figure 3:
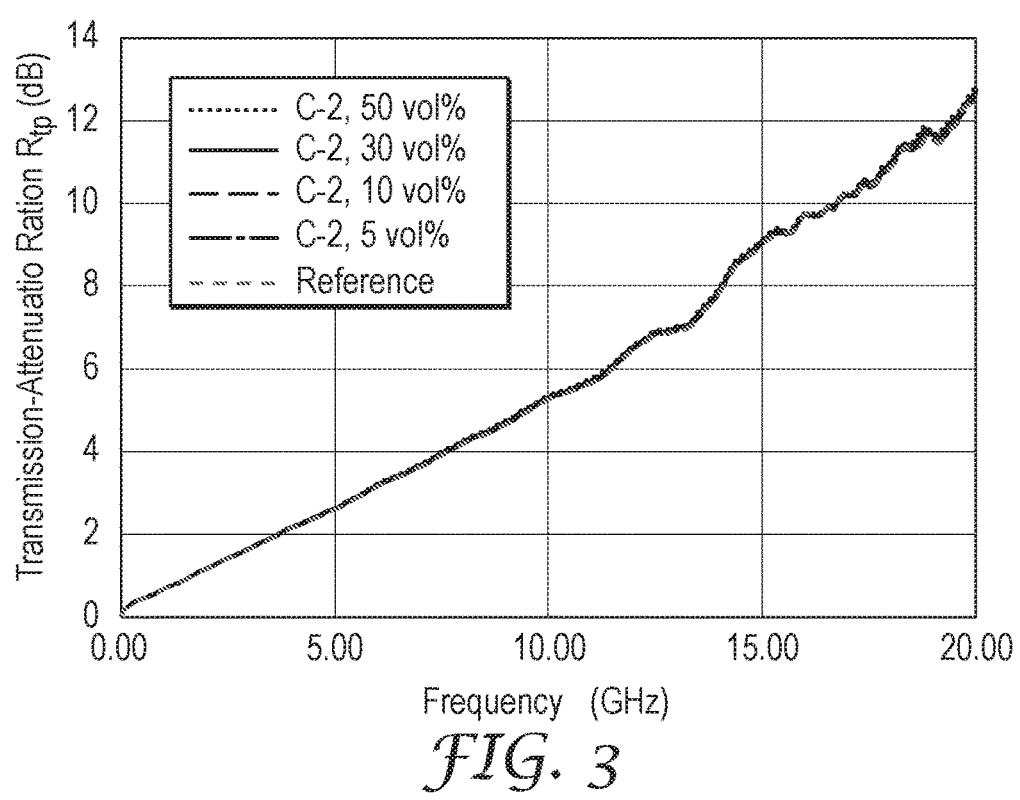
FIG. 3 a plot of Transmission-Attenuation Ratio, $R_{tp}$, vs. Frequency for the composites of Comparative Example C-2 at loading levels of 5, 10, 30 and 50 volume %.
Figure 4:
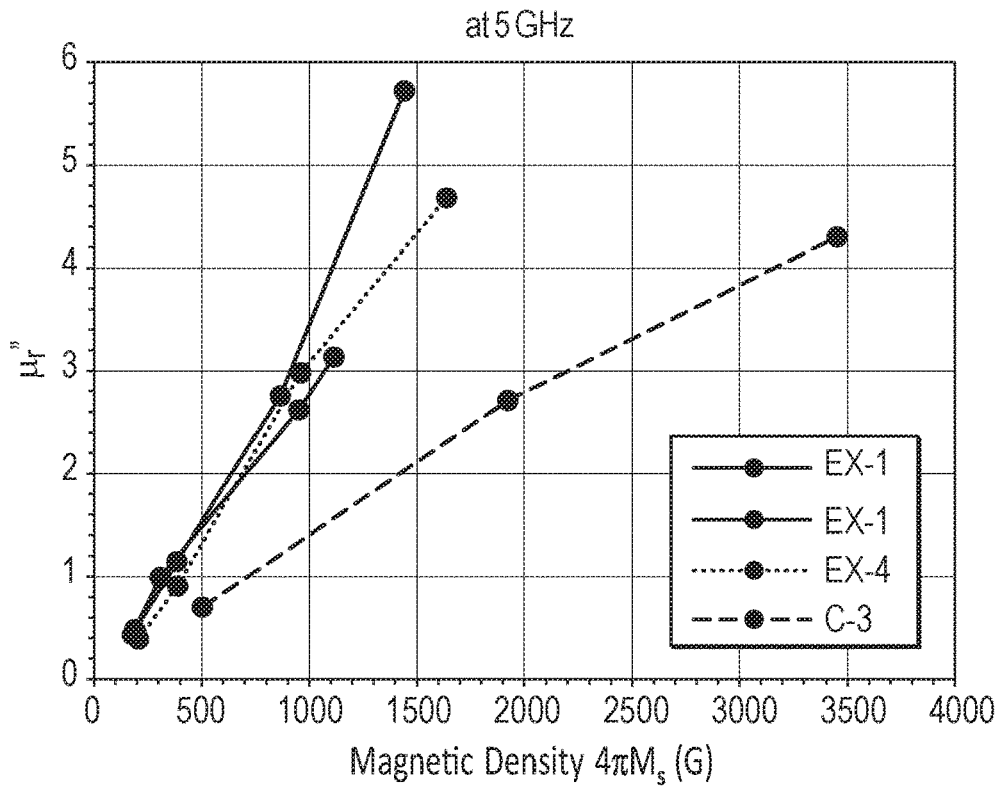
FIG. 4 is a plot of the Imaginary Component of Relative Permeability, $\mu_r$, vs. Magnetic Density, $4\pi M_s$, for Example E-1, Example E-4 and Comparative Example C-3.

Results are presented in FIGS. 1, 2, and 3. Results noted "Reference" were measured with no sample in the apparatus.

Electromagnetic Properties Characterization

Relative dielectric permittivity $$\varepsilon_r = \varepsilon_r' - j\varepsilon_r''$$

and magnetic permeability $$\mu_r = \mu_r' - j\mu_r''$$

of composites were measured in accordance with ASTM D5568-14, where $\varepsilon_r'$, $\mu_r'$ and $\varepsilon_r''$, $\mu_r''$ are real and imaginary parts (components), respectively. Samples were laser cut to fit into rectangular waveguides: WR187 with 3.95-5.85 GHz test range; and WR90 with 8.2-12.4 GHz test range. Silver paint (Sliver Print II, CC Electronics) was applied to samples edges in order to improve electrical contact and fill small gaps between sample and waveguides body. This reduced errors in permittivity measurements. S-parameters were measured using network analyzer Agilent PNA E8363Z, and TRL calibration was performed with waveguides following D5568–14. Permittivity and permeability were derived from S-parameters following "Iterative Four-Parameter Algorithm". Absorptivity for samples was calculated as Attn=−20*$\log_{10}$e*Im{k} in dB/m, where k=2πf $\sqrt{\mu_0\mu_r\varepsilon_0\varepsilon_r}$ with $\mu_0$ and $\varepsilon_0$ being magnetic permeability and permittivity of vacuum, respectively.

Composite Sample Preparation

All the following examples were characterized in the form of a composite with the particles dispersed in BUTVAR-B-98. The components of the composites are given in Table 2. particle loadings are expressed as target loading values, assuming zero final void volume in the final composite.

TABLE 2

| Material | Relative Loadings |
|---|---|
| Toluene | 600 mL per 1.0 liter of solvent mixture |
| Ethanol | 400 mL per 1.0 liter of solvent mixture |
| BUTVAR-B-98 | 116.68 g dissolved in 1.0 liter of solvent mixture |
| Particle | Adjusted to give target loadings of 5, 10, 30, and 50 vol % in the final composites |
| Solsperse 13940 | 0.0693 g per cc of particle |

Mixing of the above components for solvent casting was accomplished using a FlackTek Speedmixer. The mixing conditions were 2 minutes at 2,300 rpm. Samples were usually mixed in 60 mL batches for coating.

The mixtures composed of solvent, binder, surfactant, and particle were coated onto a release liner (RF02NAS) using a notch bar equipped with a gap set by two adjustable micrometers.

Notch bar gaps ranged between 30 and 40 mils (762 micrometers and 1,016 micrometers) and were adjusted according to particle loading and quality of the coated solution. The coated films were air dried in a hood for at least 30 minutes, followed by drying in a solvent-rated drying oven at 80° C. for at least two hours.

Two plies of the coated and dried film were laminated together with their smooth sides (release liner side) facing out. Specimens measuring 75 mm by 75 mm were placed between two release liners and backed by a compliant fiber-reinforced rubber pad, all sandwiched between two metal plates. The hot press cycle consisted of 3 minutes preheating in the press at 105° C., then 17,500 lbs (78 kN) of force was applied at the same temperature and held for 3 minutes, then the press was cooled under pressure to 40° C. in about 3 minutes using water. The final specimens were about 100 microns thick. They were trimmed down to 55 mm by 55 mm squares for characterization.

Example 1 (EX-1)

A 500 mL, two-neck Schlenk flask was charged with 20 g of high aspect ratio glass flakes. Then about 250 mL of anhydrous n-octane was added via cannula transfer. The flask was equipped with a reflux condenser and the reaction mixture was heated at reflux in a silicone oil bath. The mixture was stirred with a PTFE coated magnetic stir bar at 900 RPM under a nitrogen atmosphere. Next, 47 mL of iron pentacarbonyl were added at a rate of 0.2 mL/min via plastic syringe and a syringe pump (about 4 h addition time). The mixture was stirred for 16 hours and then removed from the heat. The solid was collected by filtration and rinsed with heptane. The resulting coated particles were dried in the vacuum oven at 60° C. for 16 h giving an isolated yield of 34.6 g.

Composites including the coated particles from EX-1 were prepared according to Composite Sample Preparation, above. The target particle loadings were 5, 10, 30, and 50 vol. %. The weights in grams of particle added to each mixture were determined using a metal coated glass flake density of 3.79 g/cc. Tables 3 and 4 summarize the electromagnetic properties of composites with coated particles from EX-1 at different volume loadings at 5 GHz and 10 GHz, respectively.

TABLE 3

| Target VL (%) | Wt % loading | ε'$_r$ | Δε'$_r$ | ε"$_r$ | Δε"$_r$ | μ'$_r$ | Δμ'$_r$ | μ"$_r$ | Δμ"$_r$ | Absorptivity (dB/m) |
|---|---|---|---|---|---|---|---|---|---|---|
| 5 | 14.9 | 46 | 9 | 4 | 1 | 0.5 | 0.7 | 0.6 | 0.7 | 1924 |
| 10 | 27.0 | 211 | 46 | 82 | 18 | 0.9 | 0.9 | 1.4 | 0.9 | 8897 |
| 30 | 58.8 | 1352 | 105 | 1952 | 134 | 1.6 | 0.6 | 3.4 | 0.6 | 59330 |
| 50 | 76.9 | 2110 | 312 | 5504 | 510 | 3.4 | 1 | 3.4 | 1 | 89721 |
| 50 | 76.9 | 2529 | 336 | 4578 | 522 | 3.2 | 1 | 3.2 | 1 | 102155 |

TABLE 4

| Target VL (%) | Wt % loading | ε'$_r$ | Δε'$_r$ | ε"$_r$ | Δε"$_r$ | μ'$_r$ | Δμ'$_r$ | μ"$_r$ | Δμ"$_r$ | Absorptivity (dB/m) |
|---|---|---|---|---|---|---|---|---|---|---|
| 5 | 14.9 | 60 | 10 | 8 | 1 | 0.8 | 0.3 | 0.1 | 0.2 | 1461 |
| 10 | 27.0 | 167 | 45 | 50 | 14 | 0.9 | 0.4 | 0.4 | 0.4 | 8622 |
| 30 | 58.8 | 755 | 58 | 771 | 60 | 0.3 | 0.2 | 0.3 | 0.2 | 28841 |
| 50 | 76.9 | 1849 | 170 | 1523 | 150 | 0.2 | 0.3 | 0.5 | 0.3 | 53293 |
| 50 | 76.9 | 1498 | 151 | 1442 | 147 | 0.1 | 0.2 | 0.5 | 0.2 | 52733 |

Example 2 (EX-2)

A 250 mL, two-neck Schlenk flask was charged with 25 g of low aspect ratio glass flakes. Then about 125 mL of anhydrous n-octane was added via cannula transfer. The flask was equipped with a reflux condenser and the reaction mixture was heated at reflux in a silicone oil bath. The mixture was stirred with a PTFE coated magnetic stir bar at 900 RPM under a nitrogen atmosphere. Next, 59 mL of iron pentacarbonyl was added at a rate of 0.2 mL/min via plastic syringe and a syringe pump (about 5 h addition time). The mixture was stirred for 20 hours and then removed from the heat. The solid was collected by filtration and rinsed with heptane. The resulting coated particles were dried in the vacuum oven at 60° C. for 16 h giving an isolated yield of 28 g.

Example 3 (EX-3)

A 500 mL, two-neck Schlenk flask was charged with 12.2 g of mid aspect ratio glass flakes. Then about 125 mL of anhydrous n-octane was added via cannula transfer. The flask was equipped with a reflux condenser and the reaction mixture was heated at reflux in a silicone oil bath. The mixture was stirred with a PTFE coated magnetic stir bar at 650 RPM under a nitrogen atmosphere. Next, 29 mL of iron pentacarbonyl was added at a rate of 0.1 mL/min via plastic syringe and a syringe pump (about 5 h addition time). The mixture was stirred for 17 hours and then removed from the heat. The solid was collected by filtration and rinsed with heptane. The resulting coated particles were dried in the vacuum oven at 60° C. for 16 h giving an isolated yield of 20 g.

Comparative 1 (C-1)

A 500 mL, two-neck Schlenk flask was charged with 30 g of high aspect ratio glass flakes. Then about 300 mL of anhydrous n-octane was added via cannula transfer. The flask was equipped with a reflux condenser and the reaction mixture was heated at reflux in a silicone oil bath. The mixture was stirred with a PTFE coated magnetic stir bar at 750 RPM under a nitrogen atmosphere. Next, 7.8 mL of iron pentacarbonyl was added at a rate of 0.1 mL/min via plastic syringe and a syringe pump (about 80 min addition time). The mixture was stirred for 16 hours and then removed from the heat. The solid was collected by filtration and rinsed with heptane. The resulting coated particles were dried in the vacuum oven at 60° C. for 16 h giving an isolated yield of 29 g.

Composites including the coated particles of C-1 were prepared according to Composite Sample Preparation, above. The target particle loadings were 5, 10, and 30 vol. %. The weights in grams of particles added to each mixture were determined using a metal coated glass flake density of 2.8 g/cc.

Comparative 2 (C-2)

An alumina crucible was charged with 40.6 g of color-coated glass flakes and loaded into a tube furnace. The tube furnace was continuously purged with an atmosphere of 5% hydrogen, balance nitrogen. The sample was heated to reduce the iron oxide coating to metallic iron. The temperature profile was as follows: ramp at 10° C./min to 850° C.; hold for 4 hours; and then naturally cool to 50° C. After firing, the sample weighed 38.7 g corresponding to a mass loss of 4.66%.

Composites including the coated particles of C-2 were prepared according to Composite Sample Preparation, above. The target filler loadings were 5, 10, 30, and 50 vol. %. The weights in grams of particle added to each mixture were determined using a metal coated glass flake density of 2.8 g/cc.

Example 4 (EX-4)

A 500 mL, two-neck Schlenk flask was charged with 20 g of high aspect ratio glass flakes. Then about 250 mL of n-octane was added via cannula transfer. The flask was equipped with a reflux condenser and the reaction mixture was heated at reflux in a silicone oil bath. The mixture was stirred with a PTFE coated magnetic stir bar at 900 RPM under a nitrogen atmosphere. Next, 47 mL of iron pentacarbonyl were added at a rate of 0.2 mL/min via plastic syringe and a syringe pump (about 4 hour addition time). The mixture was stirred for 16 hours and then removed from the heat. The solid was collected by filtration and rinsed with heptane. The resulting powder was dried in the vacuum oven at 60° C. for 16 h giving an isolated yield of 37.6 g. The iron coated glass flakes from were coated with silica by a modified Stober method from TEOS in ethanol. The coated glass flakes (20.00 g) were dispersed in a solution of 12 mL TEOS in 400 mL ethanol in a 1000 mL smooth-walled reactor with overhead stirring. To this a solution of 18 mL concentrated aqueous ammonia and 16 mL of water was added dropwise over 4 hours using a syringe pump (10 mL/hour rate) and then stirred at room temperature overnight. In the standard procedure, the concentration of TEOS=0.12 M, the concentration of water $H_2O$=3.6 M and the concentration of ammonia $NH_3$=0.60 M. The resulting powder was collected by filtration and rinsed with ethanol. This was dried at 60° C. in a vacuum oven to give 21.0 g of product.

Composites including the coated particles from EX-4 were prepared according to the Composite Sample Preparation, above. The target particle loadings were 5, 10, 30, and 50 vol.%. The weights in grams of particle added to each mixture were determined using a metal coated glass flake density of 3.59 g/cc. Table 5 summarizes the electromagnetic properties of composites with coated particles from EX-4 at different volume loadings at 5 GHz.

TABLE 5

| Target VL (%) | Wt % loading | $\varepsilon'_r$ | $\Delta\varepsilon'_r$ | $\varepsilon''_r$ | $\Delta\varepsilon''_r$ | $\mu'_r$ | $\Delta\mu'_r$ | $\mu''_r$ | $\Delta\mu''_r$ | Absorptivity (dB/m) |
|---|---|---|---|---|---|---|---|---|---|---|
| 5 | 15.0 | 69 | 6 | 7 | 1 | 0.5 | 0.7 | 0.4 | 0.7 | 2298 |
| 10 | 27.2 | 191 | 11 | 24 | 4 | 0.5 | 0.7 | 0.9 | 0.8 | 7373 |
| 30 | 59.0 | 780 | 90 | 146 | 10 | 0.6 | 0.6 | 3.0 | 0.6 | 31264 |
| 50 | 77.0 | 1090 | 150 | 232 | 30 | 1 | 0.8 | 4.7 | 0.8 | 46910 |

Comparative 3 (C-3)

Composites including particles of Permalloy (Py) flake were prepared according to the Composite Sample Preparation, above. The target particle loadings were 10, 30, and 50 vol. %. The weights in grams of particles added to each mixture were determined using a flake density of 8.74 g/cc. Table 6 summarizes the electromagnetic properties of composites with particles of Py flake at 5 GHz.

TABLE 6

| Target VL (%) | Wt % Loading | $\varepsilon'_r$ | $\Delta\varepsilon'_r$ | $\varepsilon''_r$ | $\Delta\varepsilon''_r$ | $\mu'_r$ | $\Delta\mu'_r$ | $\mu''_r$ | $\Delta\mu''_r$ | Absorptivity (dB/m) |
|---|---|---|---|---|---|---|---|---|---|---|
| 10 | 47.6 | 188 | 25 | 71 | 15 | 0.6 | 0.7 | 0.7 | 0.8 | 7112 |
| 30 | 77.8 | 3360 | 400 | 2355 | 400 | −0.8 | 0.7 | 2.7 | 0.9 | 92357 |
| 50 | 89.1 | 4960 | 1200 | 5240 | 1200 | −2.5 | 1.5 | 4.3 | 1.5 | 171239 |

Thus, the present disclosure provides, among other things, a composite that mitigates electromagnetic interference in the frequency range of 1 GHz to 100 GHz. Various features and advantages of the present disclosure are set forth in the following claims.

What is claimed is:

1. A composite comprising:
a polymeric matrix; and
electromagnetic (EM) absorbers dispersed within the polymeric matrix, each EM absorber comprising a dielectric flake and a magnetic coating that completely encapsulates the dielectric flake,
wherein the dielectric flake comprises an aluminate glass or a silicate glass, and
wherein the EM absorbers function as dielectric and magnetic absorbers in the 1-100 GHz frequency range.

2. The composite of claim 1, wherein the dielectric flake comprises a silicate glass.

3. The composite of claim 1, wherein the magnetic coating comprises a ferromagnetic material or ferrimagnetic material.

4. The composite of claim 1, wherein the magnetic coating comprises a metal, a metal alloy, a ceramic ferrite, or a combination thereof.

5. The composite of claim 1, wherein the magnetic coating comprises iron metal.

6. The composite of claim 1, wherein the EM absorbers make up 5-90 wt % of the composite.

7. The composite of claim 1, wherein the polymeric matrix comprises a chlorine-containing polymer, a fluorocarbon-based polymer, an epoxy-based polymer, a (meth) acrylate polymer, a polyether polymer, co-polymers of such, or a combination thereof.

8. The composite of claim 1, wherein the polymeric matrix comprises a silicone, a cyclic olefin copolymer (COC), a low-density polyethylene (LDPE), a high-density polyethylene (HDPE), a polystyrene (PS), a polypropylene (PP), a polyphenylene sulfide (PPS), a polyimide (PI), a syndiotactic polystyrene (SPS), a butyl rubber, an acrylonitrile butadiene styrene (ABS), a polycarbonate (PC), a polyurethane, polyvinyl butyral (PVB), or a combination thereof.

9. The composite of claim 1, wherein one or more of the EM absorbers comprise a dielectric flake having at least two magnetic coatings thereon.

10. The composite of claim 9, wherein each of the at least two magnetic coatings thereon comprise a different magnetic material.

11. The composite of claim 9, wherein each of the at least two magnetic coatings thereon have different thicknesses.

12. The composite of claim 1, wherein the composite comprises two or more different EM absorbers, wherein the two or more different EM absorbers comprise different dielectric flakes, different magnetic coatings, different ratio of components in the magnetic coatings to components in the dielectric flakes, or a combination thereof.

13. The composite of claim 1, wherein the polymeric matrix comprises polyvinyl butyral, the dielectric flake comprises borosilicate glass, and the magnetic coating is iron metal.

14. The composite of claim 13, wherein the mass ratio of silicon in the borosilicate glass to iron metal in the magnetic coating ranges from 0.1 to 0.5.

15. The composite of claim 1, further comprising a silica coating on an outermost major surface of the magnetic coating.

16. The composite of claim 1, wherein the composite mitigates electromagnetic interference in the frequency range from 1 GHz to 100 GHz.

17. The composite of claim 1, wherein the composite exhibits a saturation magnetization $M_s$ per mass of greater than 10 emu/g.

18. An electromagnetic interference (EMI) shielding article comprising the composite of claim 1.

19. A method of making the composite of claim 1 comprising:

forming the EM absorbers by applying a magnetic coating to completely encapsulate the dielectric flake; and dispersing the EM absorbers in the polymeric matrix.

20. The composite of claim 1, wherein the dielectric flake comprises a borosilicate glass.

* * * * *